United States Patent
Botti et al.

(10) Patent No.: US 7,113,032 B2
(45) Date of Patent: Sep. 26, 2006

(54) LOW DISTORTION POWER AMPLIFIER AND METHOD OF CONTROLLING A MULTI-CHANNEL POWER AMPLIFIER

(75) Inventors: Edoardo Botti, Vigevano (IT); Fabio Cagnetti, Corsico (IT)

(73) Assignee: STMicroelectronics, S.r.l., (IT)

( * ) Notice: Subject to any disclaimer, the term of this patent is extended or adjusted under 35 U.S.C. 154(b) by 26 days.

(21) Appl. No.: 10/865,667

(22) Filed: Jun. 10, 2004

(65) Prior Publication Data

US 2004/0257156 A1    Dec. 23, 2004

(30) Foreign Application Priority Data

Jun. 12, 2003    (EP) .................................. 03425380

(51) Int. Cl.
*H03F 3/68* (2006.01)
(52) U.S. Cl. .................................. 330/124 R; 330/146
(58) Field of Classification Search ............ 330/124 R, 330/146
See application file for complete search history.

(56) References Cited

U.S. PATENT DOCUMENTS

| 4,554,512 | A | * | 11/1985 | Aiello | 330/10 |
|---|---|---|---|---|---|
| 6,229,388 | B1 | * | 5/2001 | Nalbant | 330/124 R |
| 6,346,854 | B1 | | 2/2002 | Heithoff | 330/149 |
| 6,781,455 | B1 | * | 8/2004 | Kim | 330/124 R |
| 2002/0102003 | A1 | | 8/2002 | Ford | 381/120 |
| 2002/0186573 | A1 | | 12/2002 | Quintanar et al. | 363/49 |

FOREIGN PATENT DOCUMENTS

EP    0487133    5/1992

OTHER PUBLICATIONS

European Search Report, ER03425380, Dec. 5, 2003.

\* cited by examiner

*Primary Examiner*—Khanh Van Nguyen
(74) *Attorney, Agent, or Firm*—Lisa K. Jorgenson; Graybeal Jackson Haley LLP; Paul F. Rusyn

(57) ABSTRACT

A multi-channel power amplifier for driving a plurality of loads, each associated to a respective channel, each channel comprising a pair of operational amplifiers, first and second, one operational amplifier of each channel being connectable through switches either in a bridge configuration with the other operational amplifier or in single-ended configuration to a constant reference voltage for driving the load of the respective channel, the amplifier comprises circuit means for comparing the signal level of the channels with at least a threshold and outputting a logic control signal for the switches. A relative method of controlling a power amplifier that allows a sensible reduction of distortion at the price of a negligible increase of dissipated power is disclosed.

23 Claims, 4 Drawing Sheets

LOW DISTORTION POWER AMPLIFIER AND METHOD OF CONTROLLING A MULTI-CHANNEL POWER AMPLIFIER

PRIORITY CLAIM

This application claims priority from European patent application No. 03425380.7, filed Jun. 12, 2003, which is incorporated herein by reference.

TECHNICAL FIELD

The present invention relates in general to amplifiers and in particular to a method and a relative power amplifier with a reduced power consumption especially for car audio and HI-FI audio applications.

BACKGROUND

In many applications and primarily in audio reproduction systems, for example in car audios, HI-FI audio systems and similar apparatuses that are intrinsically compact because of stringent installation requirements, as well as in portable apparatuses, power dissipation in final power stages, often quadrupled in order to drive a pair of loudspeakers (front and rear) for each stereo channel, may create heat balance problems. For example, four 20 W amplifiers may have a power dissipation of about 4×12=48 W and because of the limited space available in certain apparatuses, such a relatively large power may be difficult to be dissipated without a significant increase of temperature within the apparatus.

On the other hand, a relatively high temperature of operation may degrade the magnetic tape of cassettes or optical disks (CD), the drives of which are often tightly fitted inside a single apparatus case.

The so-called D-type switching amplifiers are highly efficient and are considered the most appropriate type for these applications.

Unfortunately, switching amplifiers generate electromagnetic emissions that in compact apparatuses interfere with the correct functioning of other systems, reducing their performances. For these reasons, audio signals are frequently amplified using a pair of class AB power amplifiers, operating in single-ended or in bridge configuration depending on the level of the processed signal.

Class AB power amplifiers are less efficient than switching amplifiers and a common technique for reducing power consumption consists in configuring them in single-ended instead of in bridge configuration, whenever it is possible to do so. In fact, these amplifiers dissipate more power in bridge configuration than in single-ended configuration as long as the amplitude of the output signal remains smaller than the positive supply voltage. Unfortunately, it is not possible to use single-ended class AB amplifiers if the output surpasses this voltage because the output signal would be severely distorted by clipping.

Techniques for automatically switching from one configuration to the other in function of the monitored level of the signal are implemented in systems disclosed in U.S. Pat. No. 5,194,821, U.S. Pat. No. 5,365,188 and U.S. Pat. No. 5,654,688, all in the name of the same Applicant.

U.S. Pat. No. 5,194,821 discloses a bridge amplifier using a positive and a negative supply voltage sources. The amplifier may function in single-ended or in differential or bridge output configuration, depending on the level of the output signal. A comparator changes the output circuitry configuration of the amplifier from a bridge configuration to a single-ended configuration or vice versa by closing or opening configuring switches, when the output signal becomes smaller than or greater than a certain threshold voltage.

U.S. Pat. No. 5,365,188 and U.S. Pat. No. 5,654,688 disclose a single supply, dual bridge power amplifier employing a window comparator for sensing the level of input signals fed to the amplifier and driving switches that by coordinately changing state configure the amplifier in either a bridge or in a single-ended configuration.

Recently, power amplifiers with digital input and analog output have been proposed. As shown in FIG. 1, they are substantially composed of a digital block receiving digital input signals and generating corresponding output signals for driving the channels of the power stage. Even for these amplifiers it is possible to reduce power consumption, according to the techniques disclosed in the mentioned patents, using dedicated comparators contained in the power stage that configure the channels in single-ended or bridge configuration depending on the level of the output signals.

The above mentioned power amplifiers show good performances in terms of power consumption and low distortion of the output signals when they have a relatively low frequency, but it has been noticed that distortion increases progressively as the frequency of the processed signal increases.

SUMMARY

A probable cause of such an increased distortion may be that when the output configuration of the power amplifiers is switched from single-ended to bridge configuration (or vice versa), switching glitches generally occur. It has been noticed that when these switching glitches become too frequent, the output signal is unacceptably distorted.

An effective solution has been found to this problem. According to a method according to one aspect of this invention the output channels of a power amplifier are not reconfigured from bridge to single-end configuration in presence of high frequency and high level input signals, even if the signals become temporarily smaller than the pre-established level below which the less power consuming single-ended configuration of the channels would be normally selected.

Of course, in so doing the power consumption is increased, but the increment is practically negligible because, in audio applications, the high level signals are prevalently of medium-low frequency, relative to the audio band.

It has been found that with methods according to aspects of this invention a sensible reduction of distortion is achieved at the price of a negligible increase of dissipated power.

A method according to an aspect of this invention is implemented by a multi-channel power amplifier for driving a plurality of loads, each associated to a respective channel, each channel comprising a pair of operational amplifiers, first and second, one operational amplifier of each channel being connectable through switches either in a bridge configuration with the other operational amplifier or in single-ended configuration to a constant reference voltage for driving the load of the respective channel, the amplifier further comprising circuit means for comparing the signal level of the channels with at least a threshold and outputting a logic control signal for the switches.

The distortion due to switching glitches is reduced because in presence of a relatively high frequency signal the switchings from single-end to bridge configuration are disabled by a purposely generated appropriate logic control signal.

Various aspects of the invention is defined in the annexed claims.

BRIEF DESCRIPTION OF THE DRAWINGS

The different aspects and advantages of this invention will appear even more clear through the following description of several embodiments and by referring to the attached drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
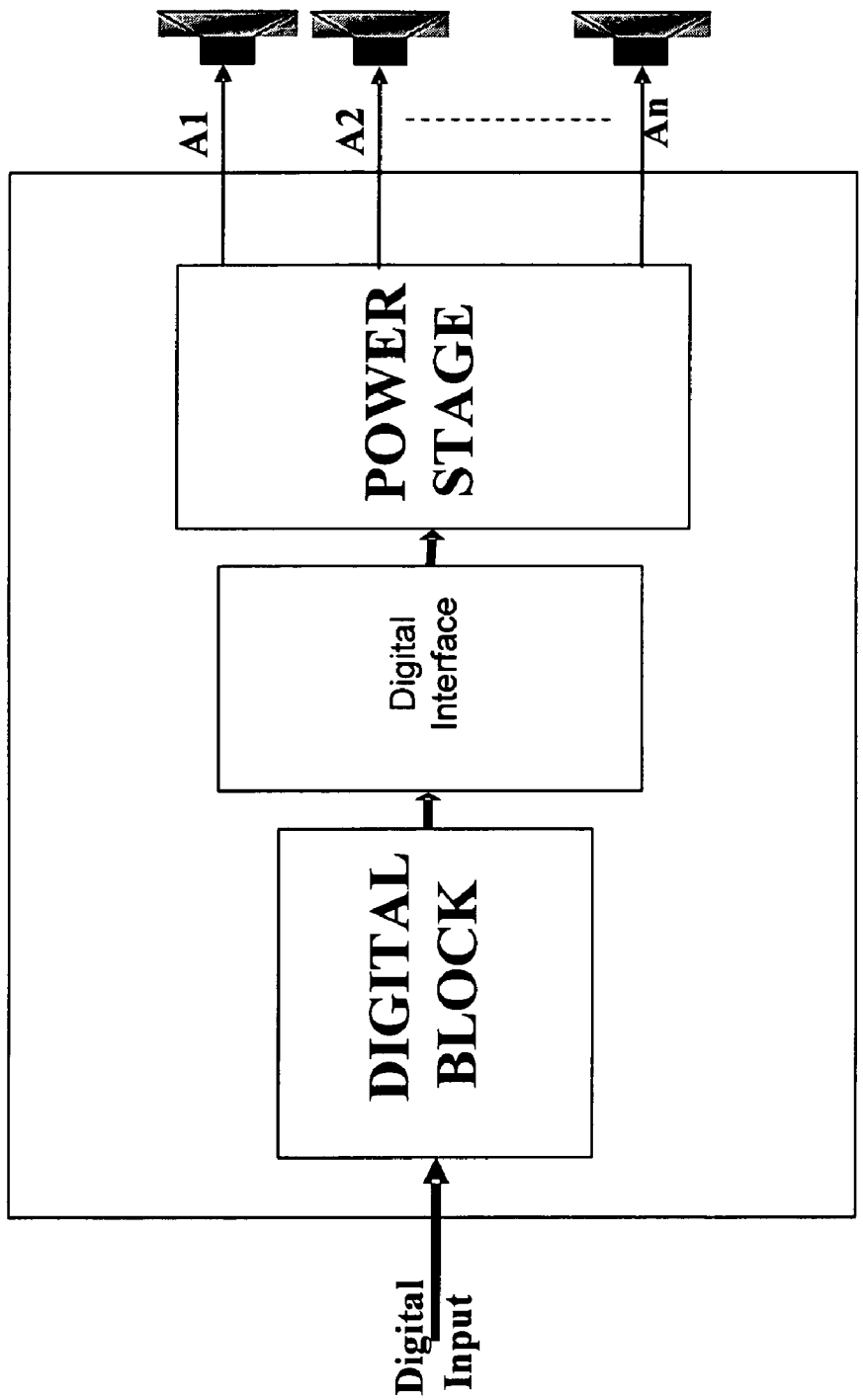
FIG. 1 shows a known power amplifier with a digital control block.
Figure 2:
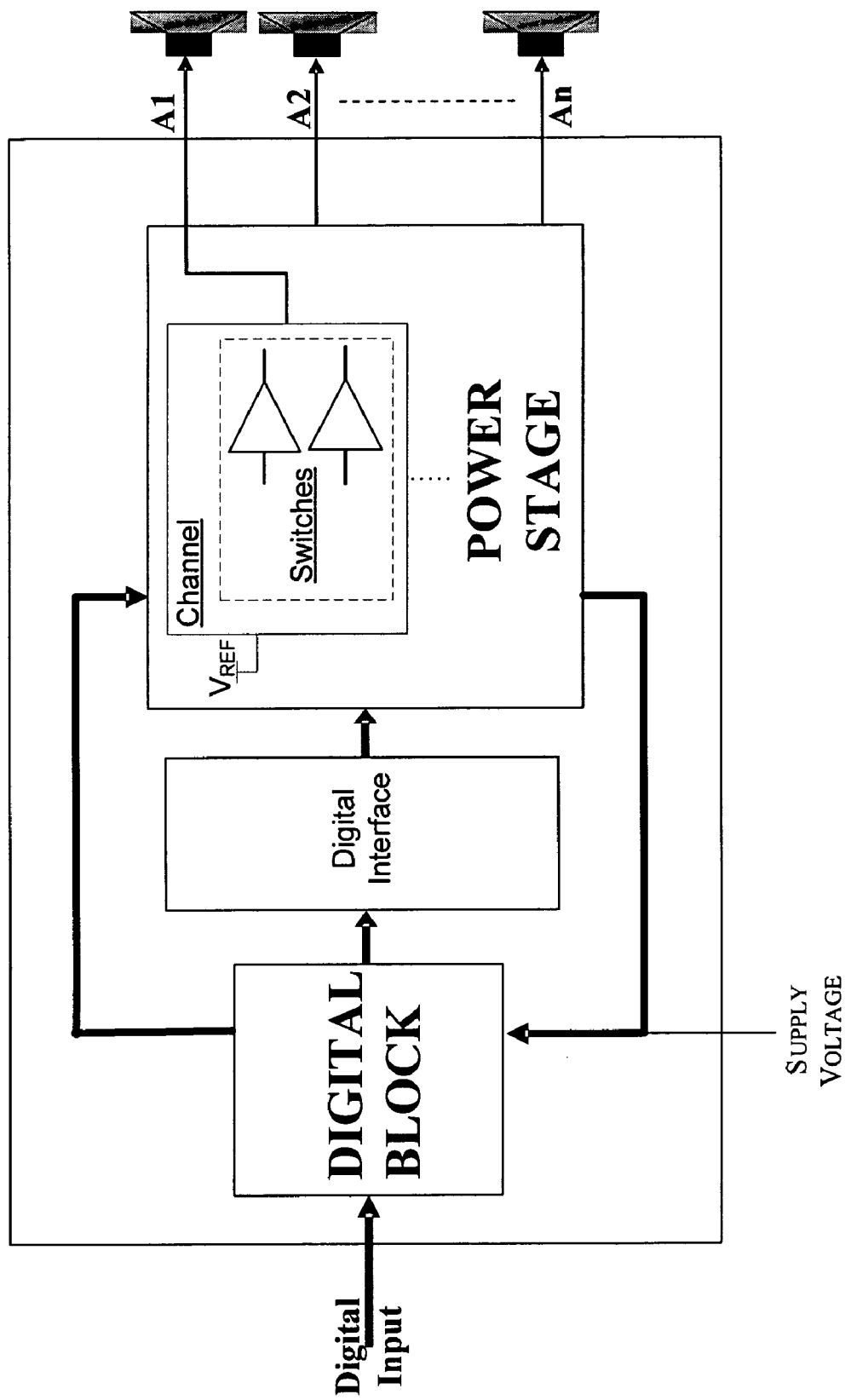
FIG. 2 is a functional scheme of a power amplifier according to one embodiment of this invention.

A functional diagram of a power amplifier according to one embodiment of this invention is depicted in FIG. 2. Differently from the known power amplifier of FIG. 1, the digital block is capable of modifying directly the configuration of the output channels in function of the digital input signals in order to implement a control algorithm for reducing distortion due to switching glitches.

Optionally, the power amplifier according to one embodiment of this invention may have a feedback bus for transmitting to the digital block sensing signals generated by sensors of certain quantities to be monitored in the power stage.

Figure 3:
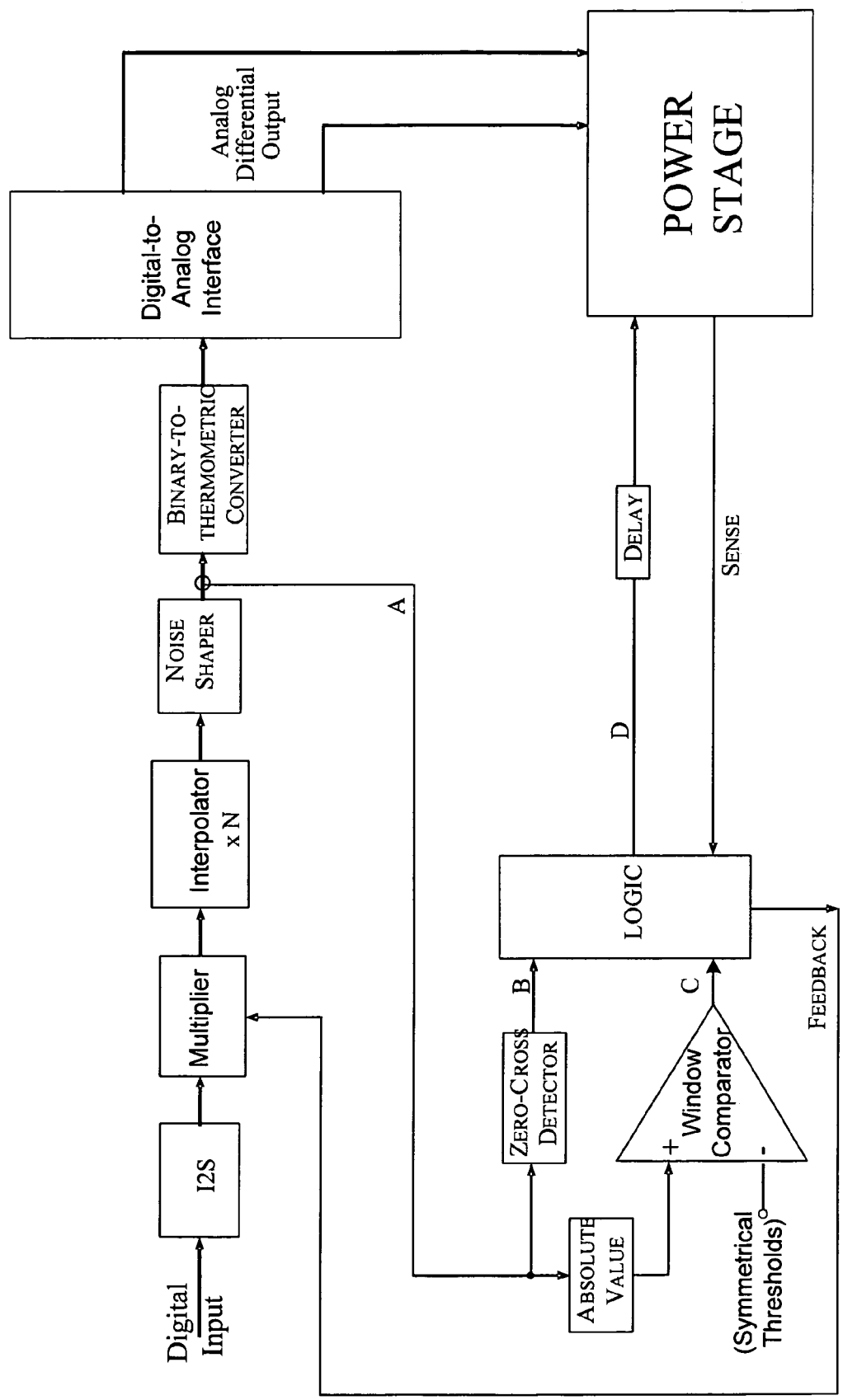
FIG. 3 is a detailed view of one embodiment of the digital control block of the power amplifier of FIG. 2.

A more detailed view of the digital block of FIG. 2 is depicted in FIG. 3.

The digital input signals, which are commonly transmitted according to an I2S protocol, are received by an I2S interface that decodes them.

A multiplier amplifies the decoded signals with a certain gain that may be regulated through a control input, and an interpolator increases the clock frequency and digitally filters the amplified signal. A noise-shaper reduces the number of bits of each received digital datum without reducing the signal-noise ratio in the audio band.

Finally a binary-to-thermometric converter converts the digital signals generated by the noise-shaper into corresponding analog signals, which are transformed into corresponding analog differential output signals by a dedicated digital-to-analog interface.

In once embodiment, the interface is of the type disclosed in the previous patent application US 2002 00636448 in the name of the same Applicant.

The peculiarity of the power amplifier of this invention consists in the fact that it has a dedicated circuitry for keeping a channel of the power stage in bridge configuration when a binary signal A output by the noise-shaper undergoes high frequency variations.

A window comparator compares the signal A with a pair of symmetrical thresholds, which may be fractions of the supply voltage, and generates a comparison logic signal C, while a zero-cross detector generates a zero-cross logic signal B that switches from one logic level to the other at each zero-cross of the signal A.

A logic circuitry LOGIC processes these two logic signals B and C and generates a logic control signal D for configuring a corresponding channel of the power stage.

Eventually this logic control signal D may be delayed for compensating the time required by the digital-to-analog interface for generating the differential output signals.

Figure 4:
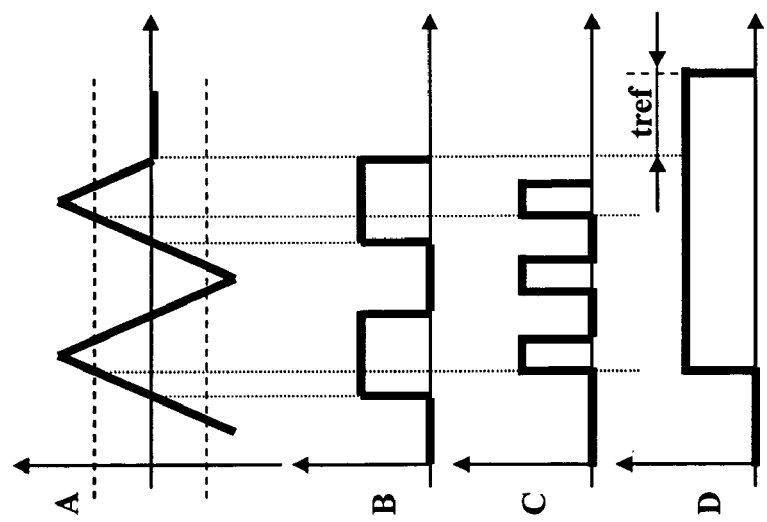
FIG. 4 illustrates by way of diagrams the functioning of the power amplifier of FIG. 2.

The algorithm implemented by the logic circuitry LOGIC is described by the time diagrams of FIG. 4.

When the signal A becomes null, the logic zero-cross signal B switches from one logic state to the other, thus each leading or trailing edge indicates a zero-cross event.

The signal A is compared with a pair of symmetrical thresholds and an active comparison logic signal C is produced each time the signal A is out of the symmetrical window of comparison.

In the known power amplifier of FIG. 1, where the signal C generated by a window comparator associated to each channel for changing the output configuration of the channels from single-ended to bridge configuration and vice versa, when a high frequency signal A is input to the power stage the signal C switches very frequently and this causes distortion of the output signal due to switching glitches.

By contrast, according to this embodiment of the present invention, the output configuration of each channel is determined by a respective logic control signal D generated by the logic circuitry LOGIC.

This signal configures in bridge configuration the channel when the comparison logic signal C becomes active, and configures them in single-ended configuration only when the signal C remains inactive for at least a certain time interval $t_{ref}$ after a zero-cross event.

In practice, the signal D is produced by masking high frequency switchings of the signal C, thus achieving a sensible reduction of distortion of the output signal.

Figure 5:
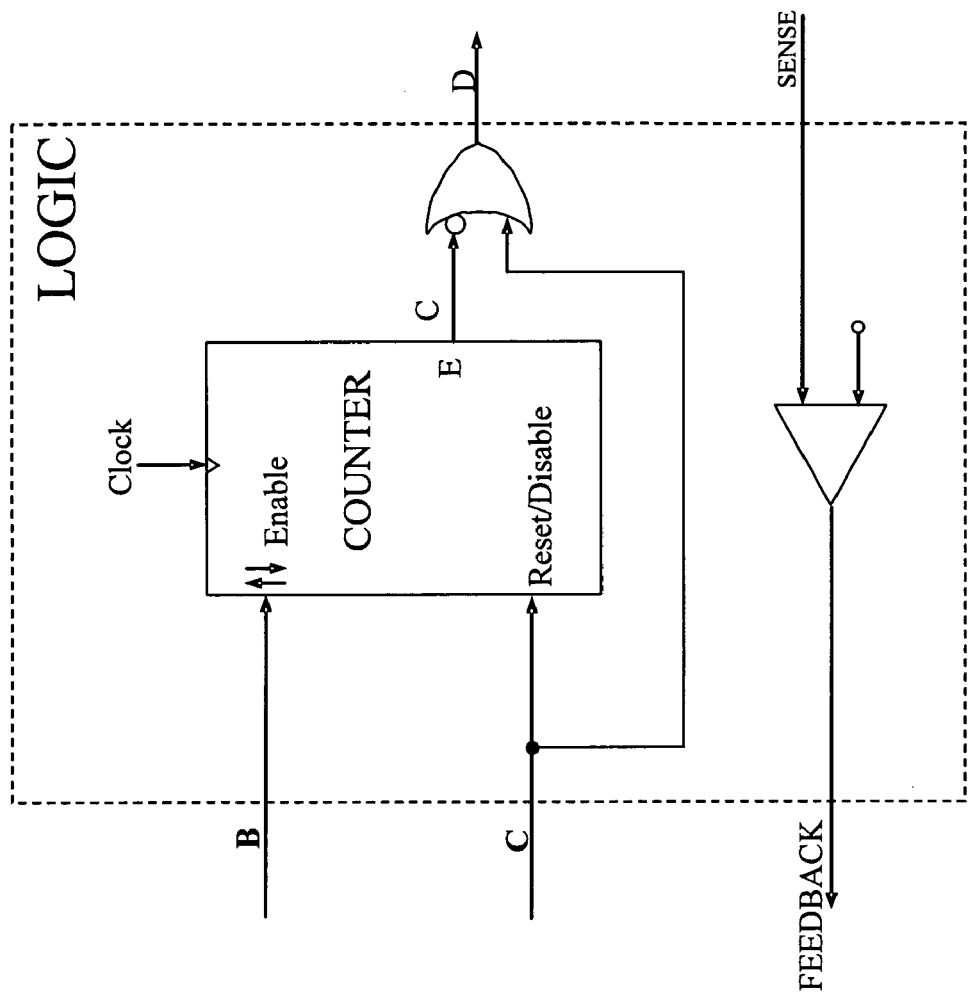
FIG. 5 is a detailed view of one embodiment of the logic circuitry of the digital block of FIG. 3.

An embodiment of the logic circuitry of FIG. 3 is depicted in FIG. 5. It is substantially composed of counter that is enabled by each edge of the zero-cross logic signal B and is reset and disabled by the comparison logic signal C.

The counter counts the pulses of a timing signal CLOCK of the digital block and generates a logically active end-count signal EC when the counting surpasses a certain number corresponding to the time interval $t_{ref}$.

Finally, the logic control signal D that configures the output of the channels is obtained by ORing the signal C and an inverted replica of the end-count signal EC.

Therefore, the signal D becomes inactive only when the signal A remains within the window of comparison for at least a time $t_{ref}$ from the last edge of the signal B.

Optionally, the power stage may have at least a sensor of the temperatures or of saturation of the output stages, that generates a corresponding sensing signal SENSE. An error amplifier of the difference between the generated sensing signal SENSE and a reference value, included in the logic circuitry LOGIC, generates a feedback signal FEEDBACK for regulating the gain of the multiplier. In this way it is possible to reduce the gain of the multiplier, and thus the level of output signal, when the temperature of the channels increases or a channel enters a clipping condition.

As an alternative, the logic circuitry may even be provided with a microprocessor unit input with the sensing signal SENSE and generating the feedback signal FEEDBACK according to any desired algorithm for controlling the gain of the multiplier.

A power amplifier according to the described embodiments of the present invention may be contained in a variety of different types of audio systems, such as a vehicle stereo system, and may be included in other types of electronic systems as well.

From the foregoing it will be appreciated that, although specific embodiments of the invention have been described herein for purposes of illustration, various modifications may be made without deviating from the spirit and scope of the invention.

The invention claimed is:

1. A multi-channel power amplifier for driving a plurality of loads, each load associated with a respective channel of a power stage of the power amplifier, each channel of the power stage comprising a pair of operational amplifiers, first and second, one operational amplifier of each channel being connectable through switches either in a bridge configuration with the other operational amplifier or in single-ended configuration to a constant reference voltage for driving the load of the respective channel, the power amplifier further comprising circuit means for comparing the signal levels of said channels with at least a threshold and outputting a logic control signal for said switches, wherein said circuit means comprise:
    at least a window comparator of said signal level generating a comparison logic signal;
    a zero-cross detector of said signal level generating a zero-cross logic signal;
    a logic circuitry input with said zero-cross logic signal and said comparison logic signal and generating said logic control signal for configuring said first operational amplifier in an output bridge configuration when the signal level remains outside the window of said comparator and for configuring said first operational amplifier in single-ended output configuration when the signal level remains within the window of said comparator for at least a pre-established time interval following a zero-cross event.

2. The multi-channel power amplifier of claim 1, wherein said circuit means compare the signal level of each channel with a at least a threshold, and output a corresponding logic control signal.

3. The multi-channel power amplifier of claim 1, wherein said logic circuitry further comprises at least a counter of pulses of a clock signal, enabled by said zero-cross logic signal and being reset and disabled by said comparison logic signal, generating a logically active end-count signal when the counting overcomes a certain number, said logic circuitry generates the logic control signal for configuring the first operational amplifier in single-ended output configuration when said end-count signal is active and said comparison logic signal is inactive.

4. The multi-channel power amplifier of claim 1, further comprising
    sensing means of the temperatures of the channels of the power stage or of a clipping condition of the loads, the sensing means generating a relative digital sensing signal;
    a digital control circuit input with said digital sensing signal, the digital control circuit generating a digital feedback signal according to a desired control algorithm;
    said circuit means further comprising a multiplier of the input signals of the power amplifier, the gain of which is controlled by said digital feedback signal.

5. The multi-channel power amplifier of claim 4, wherein said digital control circuit is an error amplifier of the difference between said digital sensing signal and a reference value.

6. A method of controlling a multi-channel power amplifier for driving a plurality of loads, each load associated with a respective channel of a power stage of the power amplifier, each channel of the power stage comprising a pair of operational amplifiers, first and second, the first operational amplifier of each channel being connectable through dedicated electrical path selecting switches either in a bridge configuration with the second operational amplifier or in single-ended configuration to a constant reference voltage for driving the respective load, the power amplifier further comprising circuit means for comparing the signal level of said channels with at least a threshold and outputting a logic control signal for said switches, the method comprising:
    comparing said signal level with symmetrical upper and lower thresholds;
    detecting zero-crosses of said signal level; and
    configuring said first operational amplifier in an output bridge configuration when the signal level remains outside the window of said comparator and configuring said first operational amplifier in a single-ended output configuration when the signal level remains within said symmetrical upper and lower thresholds for at least a pre-established time interval following a zero-cross event.

7. A power amplifier, comprising:
    a plurality of amplifying channels, each channel being adapted to receive an input signal and being operable to develop an output signal responsive to the input signal, each amplifying channel including amplifiers that operate to generate the corresponding output signal and the amplifiers being configurable in either a bridge or a single-ended configuration; and
    a control circuit coupled to the amplifying channels, the control circuit operable to configure the amplifiers in each amplifying channel to operate in either the bridge or single-ended configuration responsive to a frequency and a magnitude of the input signal, and wherein the control circuit is operable to configure the amplifiers in each amplifying channel in the bridge configuration responsive to the corresponding input signal having a value outside a threshold window.

8. The power amplifier of claim 7 wherein the threshold window corresponds to a symmetrical window around a zero-crossing value, the symmetrical window being defined by a first positive threshold and a second negative threshold with the thresholds having equal magnitudes.

9. The power amplifier of claim 8 wherein the zero-crossing value corresponding to the input signal having a value of approximately zero.

10. The power amplifier of claim 8 wherein the control circuit is operable to configure the amplifiers in each amplifying channel in the single-ended configuration when the corresponding input signal to the amplifying channel is within the threshold window for a reference time.

11. The power amplifier of claim 10 wherein the reference time corresponds to a time after the input signal has the zero-crossing value.

12. The power amplifier of claim 7 wherein the control circuit comprises:
   a zero-crossing detector adapted to receive the input signal and operable to generate a zero-crossing signal responsive to each zero crossing of the input signal;
   a window comparator adapted to receive the input signal and to generate an output signal indicating whether a magnitude of the signal is outside a threshold window; and
   logic circuitry coupled to the zero-crossing detector and the window comparator, the logic circuit operable to generate a logic control signal for configuring the amplifiers in a corresponding channel in the bridge configuration when the output signal from the comparator indicates the input signal is outside the threshold window of the comparator, and is operable to generate the logic control signal to configure the amplifiers in the channel in the single-ended configuration when the output signal from the comparator indicates the input signal is within threshold window for at least a reference time after the zero-crossing detector detects a zero-crossing of the input signal.

13. The power amplifier of claim 12 wherein the logic circuitry comprises a counter having an enable input coupled to the zero-crossing detector to receive the zero crossing signal, a reset input coupled to the window comparator to receive the output signal from the window comparator, and a clock input adapted to receive a clocking signal, the counter operable to increment a count value and to activate an end count signal responsive to the count value equaling a determined value.

14. The power amplifier of claim 7 further comprising:
   a multiplier circuit operable to multiply the input signal to a respective channel by a gain, the gain having a value that is determined responsive to a control input signal; and
   feedback circuitry coupled to the amplifying channels and to the multiplier circuit, the circuitry operable to detect an operating characteristic of the channels and to adjust the value of the gain as a function of the detected operating characteristic.

15. The power amplifier of claim 14 wherein the operating characteristic comprises at least one of temperature and saturation of the amplifying channels.

16. An electronic system, comprising:
   a decoder adapted to receive a digital input signal and operable to generate a decoded input signal from the digital input signal;
   a power amplifier coupled to the decoder to receive the decoded input signal, the power amplifier including,
      a plurality of amplifying channels, each channel being adapted to receive an input signal and being operable to develop an output signal responsive to the input signal, each amplifying channel including amplifiers that operate to generate the corresponding output signal and the amplifiers being configurable in either a bridge or a single-ended configuration; and
      a control circuit coupled to the amplifying channels, the control circuit operable to configure the amplifiers in each amplifying channel to operate in either the bridge or single-ended configuration responsive to a frequency and a magnitude of the input signal, wherein the control circuit is operable to configure the amplifiers in each amplifying channel in the bridge configuration responsive to the corresponding input signal having a value outside a threshold window.

17. The electronic system of claim 16 further comprising a multiplier circuit, a interpolation circuit, a noise-shaper circuit, a binary-to-thermometric converter, and a digital-to-analog interface coupled between the decoder and the power amplifier.

18. The electronic system of claim 16 wherein the system comprises an audio system comprising audio circuitry coupled to the decoder and power amplifier.

19. A method of configuring amplifying channels in a multi-channel power amplifier, each channel being adapted to receive an input signal and the method for each channel comprising:
   detecting whether the input signal is within or outside a threshold range defined by two threshold voltages;
   detecting zero-crossings of the input signal;
   configuring the amplifying channel in a first configuration responsive to the input signal being outside the threshold range; and
   configuring the amplifying channel in a second configuration responsive to the input signal being within the threshold range for at least a reference time after detection of a zero crossing of the input signal.

20. The method of claim 19 wherein the threshold range is defined by a first positive threshold relative to a zero-crossing value and a second negative threshold relative to the zero crossing value, the positive and negative thresholds having equal magnitudes.

21. The method of claim 19 wherein the zero-crossing value has a value of approximately zero.

22. The method of claim 19 wherein the first configuration corresponds to a configuration having a first power consumption level and wherein the second configuration corresponds to a configuration having a second power consumption level that is less than the first power consumption level.

23. The method of claim 19 wherein the first configuration comprises a bridge configuration and wherein the second configuration comprises a single-ended configuration.

* * * * *